United States Patent
Elbaz et al.

(10) Patent No.: US 11,165,220 B2
(45) Date of Patent: Nov. 2, 2021

(54) STRUCTURE COMPRISING A STRAINED SEMICONDUCTOR LAYER ON A HEAT SINK

(71) Applicants: CENTRE NATIONAL DE LA RECHERCHE SCIENTIFIQUE, Paris (FR); STMicroelectronics (Crolles 2) SAS, Crolles (FR); Universite Paris-Saclay, Saint-Aubin (FR)

(72) Inventors: Anas Elbaz, Savigny le temple (FR); Moustafa El Kurdi, Cachan (FR); Abdelhanin Aassime, Montlhéry (FR); Philippe Boucaud, Paris (FR); Frederic Boeuf, Le Versoud (FR)

(73) Assignees: STMicroelectronics (Crolles 2) SAS, Crolles (FR); Universite Paris-Saclay, Saint-Aubin (FR); Centre National de la Recherche Scientifique, Paris (FR)

( * ) Notice: Subject to any disclaimer, the term of this patent is extended or adjusted under 35 U.S.C. 154(b) by 16 days.

(21) Appl. No.: 16/757,308

(22) PCT Filed: Oct. 19, 2017

(86) PCT No.: PCT/FR2017/052881
§ 371 (c)(1),
(2) Date: Apr. 17, 2020

(87) PCT Pub. No.: WO2019/077210
PCT Pub. Date: Apr. 25, 2019

(65) Prior Publication Data
US 2021/0119416 A1    Apr. 22, 2021

(51) Int. Cl.
*H01S 5/00* (2006.01)
*H01S 5/024* (2006.01)
(Continued)

(52) U.S. Cl.
CPC .......... *H01S 5/02461* (2013.01); *H01S 5/021* (2013.01); *H01S 5/02469* (2013.01);
(Continued)

(58) Field of Classification Search
CPC .... H01S 5/1042; H01S 5/021; H01S 5/02461; H01S 5/02469; H01S 5/3027;
(Continued)

(56) References Cited

U.S. PATENT DOCUMENTS 7,038,290 B1 * 5/2006 Li .................... H01L 21/761
257/506
2013/0294472 A1 * 11/2013 Feng .................... H01S 5/22
372/50.22
(Continued)

FOREIGN PATENT DOCUMENTS

WO    2016142588 A1    9/2016

OTHER PUBLICATIONS

Ghrib, Abdelhamid, et al., "All-Around SiN Stressor for High and Homogeneous Tensile Strain in Germanium Microdisk Cavities", Advanced Optical Materials, vol. 3, Mar. 2015, pp. 353-358.

*Primary Examiner* — Kinam Park
(74) *Attorney, Agent, or Firm* — Slater Matsil, LLP

(57) ABSTRACT

A structure includes a semiconductor support, a semiconductor region overlying the semiconductor support, a silicon nitride layer surrounding and straining the semiconductor region, and a metal foot separating the silicon nitride layer from the semiconductor support. The semiconductor region includes germanium. The semiconductor region can be a resonator of a laser or a waveguide.

24 Claims, 3 Drawing Sheets

(51) Int. Cl.
  *H01S 5/02*    (2006.01)
  *H01S 5/10*    (2021.01)
  *H01S 5/30*    (2006.01)
  *H01S 5/32*    (2006.01)
  *H01S 5/34*    (2006.01)

(52) U.S. Cl.
  CPC .......... *H01S 5/1042* (2013.01); *H01S 5/3027* (2013.01); *H01S 5/3218* (2013.01); *H01S 5/1075* (2013.01); *H01S 5/3403* (2013.01); *H01S 2301/176* (2013.01)

(58) Field of Classification Search
  CPC .... H01S 5/3218; H01S 5/3403; H01S 5/1075; H01S 2301/176
  See application file for complete search history.

(56) References Cited

U.S. PATENT DOCUMENTS

| | | | |
|---|---|---|---|
| 2015/0055669 A1* | 2/2015 | Tani | H01S 5/0206 372/45.01 |
| 2018/0048123 A1* | 2/2018 | Prost | H01S 5/3223 |

* cited by examiner

STRUCTURE COMPRISING A STRAINED SEMICONDUCTOR LAYER ON A HEAT SINK

CROSS-REFERENCE TO RELATED APPLICATIONS

This patent application is a national phase filing under section 371 of PCT/FR2017/052881, filed on Oct. 19, 2017, the content of which is incorporated herein by reference in its entirety.

TECHNICAL FIELD

The present disclosure relates to a structure comprising a strained semiconductor layer comprising at least germanium.

BACKGROUND

Strained germanium and strained alloys of germanium and of one or a plurality of other semiconductor components are typically used in optoelectronics and, more particularly, in the manufacturing of lasers, of waveguides. They are also used in microelectronics for the forming of CMOS-type transistors.

There exist different methods to obtain strained germanium, one of which comprises enclosing a germanium layer between two strained silicon nitride layers. This method is described in the article entitled "All-Around SiN Stressor for High and Homogeneous Tensile Strain in Germanium Microdisk Cavities" of Abdelhamid Ghrib et al. published in March 2015 in Advanced Optical Materials, volume 3, pp. 353 to 358.

It would be desirable to be able to at least partly improve certain aspects of known structures enabling to strain germanium or, for example, an alloy of germanium and tin.

SUMMARY

An embodiment provides a structure comprising, on a semiconductor support, a portion of a semiconductor layer, or of a stack of semiconductor layers, comprising germanium, and a silicon nitride layer surrounding and straining the portion. The semiconductor support is separated from the silicon nitride layer by a metal foot.

According to an embodiment, the metal foot is made of aluminum or of a compound of aluminum and of silicon.

According to an embodiment, the semiconductor layer or each of the semiconductor layers of the stack of semiconductor layers is made of germanium, of germanium-tin, or of silicon-germanium-tin.

According to an embodiment, the portion is a resonator of a laser.

According to an embodiment, the portion is a waveguide.

According to an embodiment, the metal foot has a height greater than 600 nm.

According to an embodiment, the portion has a thickness in the range from 200 to 500 nm.

According to an embodiment, the silicon nitride layer has a thickness in the range from 200 to 700 nm.

According to an embodiment, the metal foot is bonded to the semiconductor support via a stack of bonding layers.

According to an embodiment, the stack of bonding layers has a height in the order of 100 nm.

According to an embodiment, the stack of bonding layers comprises two silicon oxide layers.

According to an embodiment, the stack of bonding layers comprises two gold layers and an anti-diffusion layer.

According to an embodiment, the anti-diffusion layer is made of silicon oxide or of silicon nitride.

Another embodiment provides a method of manufacturing a structure comprising the successive steps of forming on a surface of a first semiconductor support a stack of layers successively. The stack of layers comprises a portion of a semiconductor layer or of a stack of semiconductor layers, comprising germanium, a first silicon nitride layer, and a metal layer straining the first silicon nitride layer. The method further comprises bonding a surface of a second semiconductor support to the metal layer, separating the stack from the first support, selectively etching the metal layer to decrease its width with respect to the lateral dimension of the first silicon nitride layer, and isotropically depositing a second silicon nitride layer on the semiconductor layer.

According to an embodiment, the second semiconductor support is bonded to the metal layer by a thermocompression bonding or by a molecular bonding.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. For the sake of clarity, only the elements that are useful for an understanding of the embodiments described herein have been illustrated and described in detail.

In the following disclosure, when reference is made to terms qualifying a relative position, such as the terms "top", "upper", "lower", etc., reference is made to the orientation of the concerned element in the figures. Unless specified otherwise, the expression "in the order of" signifies within 10%, and preferably within 5%.

Figure 1:
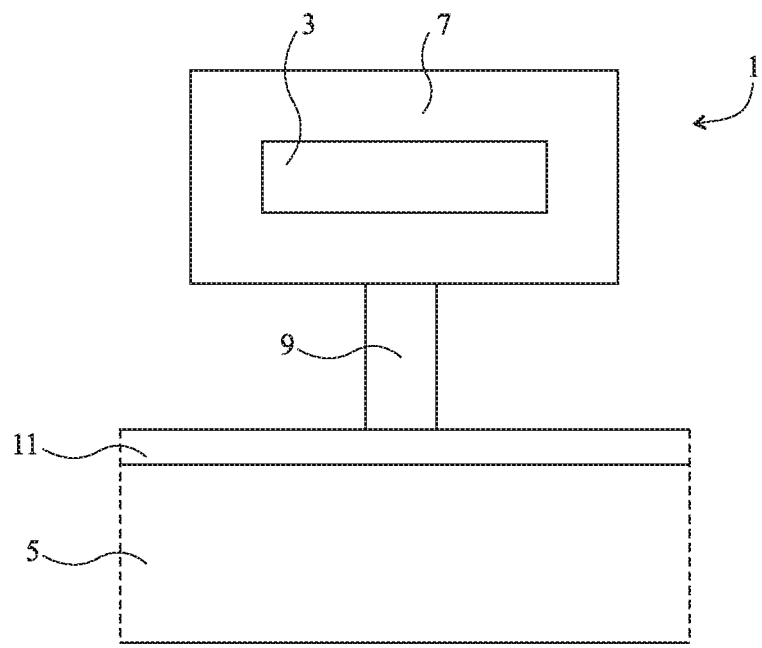
FIG. 1 is a cross-section view of a structure comprising a strained semiconductor layer.

FIG. 1 is a cross-section view of a structure 1 comprising a strained semiconductor layer, comprising germanium, described in the article previously mentioned in the discussion of prior art.

Structure 1 comprises a portion of a strained semiconductor layer 3 comprising germanium arranged above a semiconductor support 5, for example, made of silicon. Layer portion 3 is surrounded with a strained silicon nitride layer 7. Layer 7 strains layer portion 3. Layer 7 has a thickness of the same order of magnitude as that of layer portion 3. Layer portion 3 and layer 7 are separated from semiconductor support 5 by a silicon oxide foot 9. In top view, foot 9 has a size smaller than that of layer portion 3. The upper surface of support 5 is for example covered with silicon oxide 11 in contact with foot 9. In practice, this type of structure is formed inside and on top of an SOI-type structure ("Silicon On Insulator"), where foot 9 is formed from the BOX buried insulating layer ("Buried Oxide").

Figure 2:
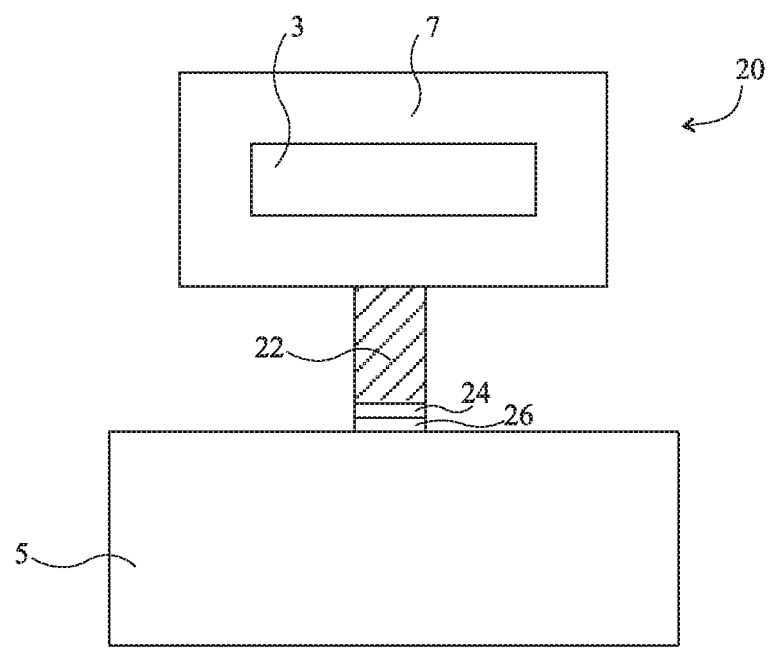
FIG. 2 is a cross-section view of an embodiment of a structure comprising a strained semiconductor layer.

FIG. 2 is a cross-section view of an embodiment of a structure 20 comprising strained germanium. Structure 20 is identical to the structure 1 of FIG. 1, with the difference that the silicon oxide foot 9 of FIG. 1 is replaced with a metal foot 22.

As an example, layer portion 3 is made of germanium or of a germanium alloy and of one or a plurality of compounds, for example, an alloy of germanium and tin or an alloy of germanium, silicon, and tin. Layer portion 3 has a thickness for example in the range from 200 to 500 nm, for example, in the order of 350 nm. As a variation, layer portion 3 may be a portion of a stack of layers comprising germanium. Layer portion 3 may correspond to a microdisk used as a resonator for a laser, for example, a germanium-tin laser, to a waveguide, or also be a layer with multiple quantum wells, for example formed in a waveguide or in a microdisk.

Silicon nitride layer 7 has a thickness in the order of that of layer portion 3. The silicon nitride layer strains layer portion 3. As an example, layer 7 has a thickness in the range from 200 to 700 nm, for example, in the order of 450 nm.

Metal foot 22 is for example made of aluminum or of a compound of aluminum and silicon. Foot 22 for example has a minimum height in the order of 600 nm. Metal foot 22 is bonded to support 5 by a thermocompression bonding or by a molecular bonding. The molecular bonding is a bonding between a silicon oxide layer and another silicon oxide layer, the upper surface of support 5 is covered with a silicon oxide layer 26, and the lower surface of foot 22 is covered with a silicon oxide layer 24. In the case of a gold-to-gold bonding, the upper surface of support 5 is covered with a gold layer 26 and the lower surface of foot 22 is covered with a gold layer 24. However, to avoid the diffusion of gold atoms into metal foot 22, layer 24 is separated from foot 22 by an anti-diffusion layer (not shown in FIG. 2), for example, made of silicon nitride or of silicon oxide. In the case of a gold-to-gold bonding, the assembly of layers 26 and 24 for example has a height in the order of 100 nm and for example capable of ranging up to 1 µm, and the anti-diffusion layer has a maximum height of 150 nm. In the case of a bonding between silicon oxide, the assembly of layers 26 and 24 for example has a height in the order of 100 nm and for example capable of ranging up to 2 µm.

An advantage of this embodiment is that the material of foot 22 is a better heat conductor than silicon oxide. This enables to dissipate the heat generated in layer portion 3 towards semiconductor support 5 during the use of structure 20. This is more particularly useful when layer portion 3 is used as an emitting area in a resonator to form a laser.

Another advantage of this embodiment is that the foot made of aluminum or of an alloy of aluminum and silicon keeps the same properties as a silicon oxide foot, for example, as concerns the deformation transfer.

Still another advantage of this embodiment is that it is possible to create electric contacts crossing foot 22.

FIGS. 3A to 3F are cross-section views of steps of an embodiment of a method of manufacturing a structure of the type of structure 20 of FIG. 2.

Figure 3A:
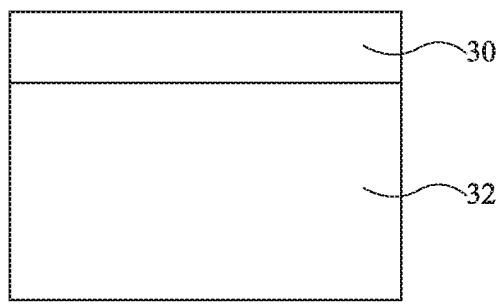
FIGS. 3A to 3F are cross-section views of a method of manufacturing the structure of FIG. 2.

At the step of FIG. 3A, a semiconductor layer 30 made of germanium or of an alloy of germanium and of one or a plurality of compounds is formed on a semiconductor support 32, for example, made of silicon. Layer 30 is for example formed by epitaxy. Layer 30 for example has a thickness in the range from 200 to 500 nm.

Figure 3B:
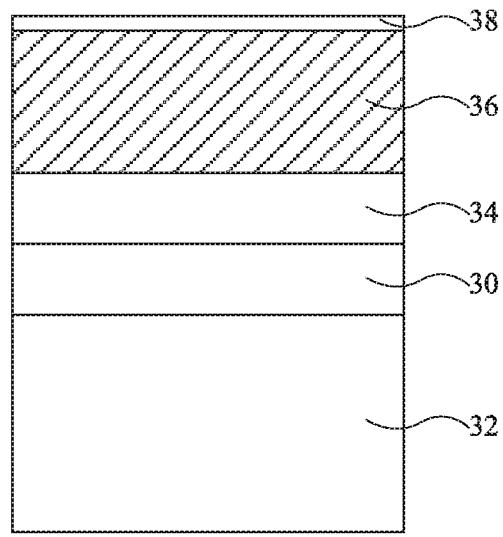

At the step of FIG. 3B, a silicon nitride layer 34 is deposited on semiconductor layer 30. The silicon nitride layer has a thickness in the order of that of layer 30, for example, in the range from 200 to 700 nm. A metal layer 36 is deposited on silicon nitride layer 34. Metal layer 36 is capable of straining silicon nitride layer 34. Metal layer 36 is for example made of aluminum, or of a compound of aluminum and silicon. Metal layer 36 for example has a thickness greater than 600 nm. A gold-to-gold bonding is here considered and an anti-diffusion layer 38 is deposited on metal layer 36.

Figure 3C:
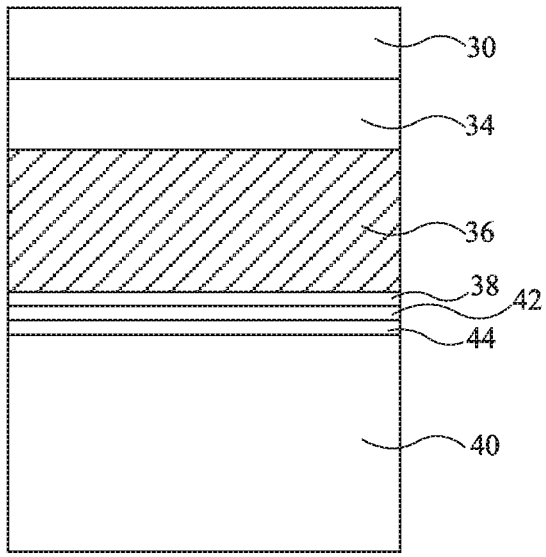

At the step of FIG. 3C, the structure of FIG. 3B is flipped and then bonded to a semiconductor support 40. For this purpose, the exposed surface of anti-diffusion layer 38 and the upper layer of support 40 are covered with a gold layer and then positioned on each other, it is spoken of a molecular bonding. The stack comprising semiconductor layer 30, silicon nitride layer 34, metal layer 36, and anti-diffusion layer 38 is then separated from support 32 to leave a surface of semiconductor layer 30 exposed. The assembly comprising anti-diffusion layer 38 and gold layers 42 and 44 is called bonding stack hereafter.

Figure 3D:
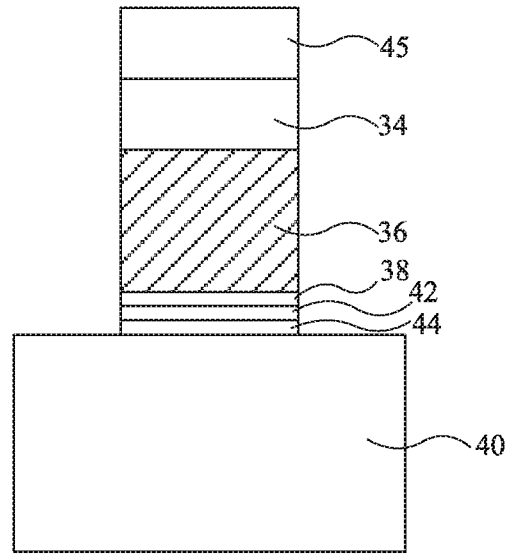

At the step of FIG. 3D, layer 30 is submitted to various modification steps (not described herein) such as for example, steps of etching, doping, etc., to become a layer portion 45. The modification steps particularly enable to give semiconductor layer portion 30 the shape necessary for its future use. As an example, the modification steps are shown in FIG. 3 as an etch step giving a specific shape to layer portion 45, for example, a circular shape. Silicon nitride layer 34, metal layer 36, and the bonding stack may also be submitted to the etch step.

Figure 3E:
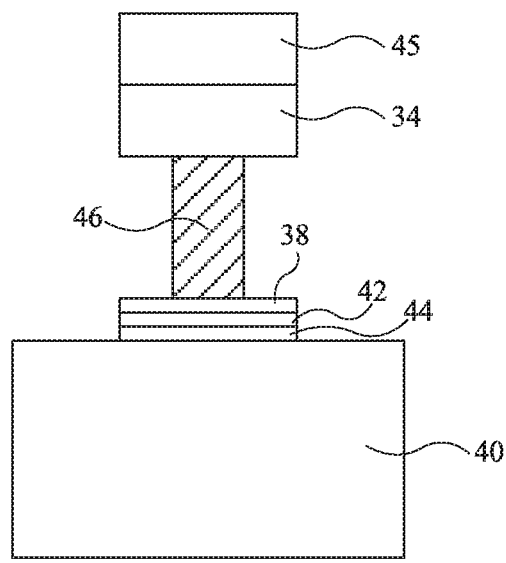

At the step of FIG. 3E, metal layer 36 is etched selectively over the other layers to form a metal foot 46. Metal foot 46 has a diameter smaller than that of layer portion 45. By decreasing the size of the contact between the metal of foot 46 and silicon nitride layer 34, the strain inflicted by foot 46 to layer 34 is also decreased and layer 34 relaxes. By relaxing, layer 34 itself applies a strain onto layer portion 45.

Figure 3F:
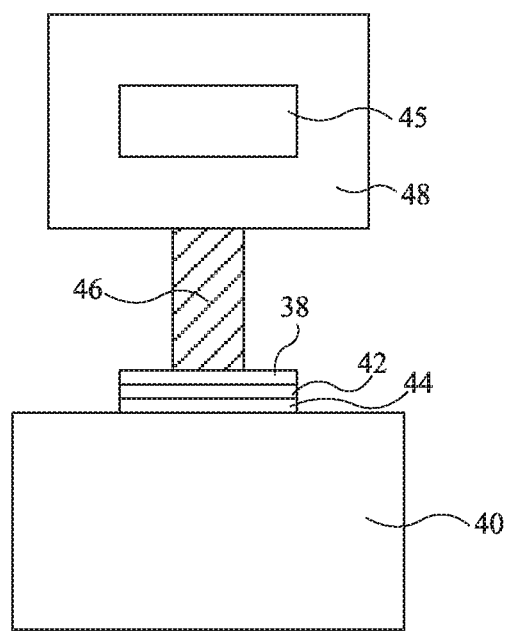

At the step of FIG. 3F, an isotropic etching of strained silicon nitride is performed on layer portion 45. The isotropic deposition may be performed selectively. This deposition enables to form, from layer 34, a silicon nitride layer 48 surrounding and straining layer portion 45. As an example, the deposition is a plasma-enhanced chemical vapor deposition.

Specific embodiments have been described. Various alterations and modifications will occur to those skilled in the art. In particular, layer portion 3 may be a portion of a stack of a semiconductor layers.

The invention claimed is:

1. A structure comprising:
   a semiconductor support;
   a semiconductor region overlying the semiconductor support, the semiconductor region comprising germanium;
   a silicon nitride layer surrounding and straining the semiconductor region; and
   a metal foot separating the silicon nitride layer from the semiconductor support, wherein, in a top view of the structure, the metal foot has a smaller size than the semiconductor region.

2. The structure according to claim 1, wherein the semiconductor region includes is a layer of a stack of semiconductor layers that overlie the semiconductor support and are surrounded by the silicon nitride layer.

3. A structure comprising:
   a semiconductor support;
   a semiconductor region overlying the semiconductor support, the semiconductor region comprising germanium;

a silicon nitride layer surrounding and straining the semiconductor region; and a metal foot separating the silicon nitride layer from the semiconductor support, wherein the metal foot is made of aluminum or of a compound of aluminum and of silicon.

4. The structure according to claim 1, wherein the semiconductor region comprises germanium, germanium-tin, or silicon-germanium-tin.

5. The structure according to claim 1, wherein the semiconductor region is a resonator of a laser.

6. The structure according to claim 1, wherein the semiconductor region is a waveguide.

7. The structure according to claim 1, wherein the metal foot has a height greater than 600 nm.

8. The structure according to claim 1, wherein the semiconductor region has a thickness in a range from 200 to 500 nm.

9. The structure according to claim 1, wherein the silicon nitride layer has a thickness in a range from 200 to 700 nm.

10. The structure according to claim 1, wherein the metal foot has a height greater than 600 nm, wherein the semiconductor region has a thickness in a range from 200 to 500 nm, and wherein the silicon nitride layer has a thickness in a range from 200 to 700 nm.

11. The structure according to claim 1, wherein the metal foot is bonded to the semiconductor support by a stack of bonding layers.

12. The structure according to claim 11, wherein the stack of bonding layers has a height on the order of 100 nm.

13. The structure according to claim 11, wherein the stack of bonding layers comprises two silicon oxide layers.

14. The structure according to claim 11, wherein the stack of bonding layers comprises two gold layers and an anti-diffusion layer.

15. The structure according to claim 14, wherein the anti-diffusion layer comprises silicon oxide or of silicon nitride.

16. A structure comprising:
a semiconductor support;
a semiconductor region overlying the semiconductor support, the semiconductor region comprising elemental germanium, germanium-tin, or silicon-germanium-tin, wherein the semiconductor region comprises a resonator of a laser or a waveguide;
a silicon nitride layer surrounding and straining the semiconductor region;
a metal foot separating the silicon nitride layer from the semiconductor support, the metal foot comprising aluminum; and
a stack of bonding layers bonding the metal foot to the semiconductor support.

17. The structure according to claim 16, wherein the metal foot has a height greater than 600 nm, wherein the semiconductor region has a thickness in a range from 200 to 500 nm, and wherein the silicon nitride layer has a thickness in a range from 200 to 700 nm.

18. The structure according to claim 16, wherein the stack of bonding layers comprises two silicon oxide layers.

19. The structure according to claim 16, wherein the stack of bonding layers comprises two gold layers and an anti-diffusion layer.

20. A method of manufacturing a structure comprising:
forming a stack of layers successively on a surface of a first semiconductor support, the stack of layers comprising a semiconductor region comprising germanium, a first silicon nitride layer, and a metal layer straining the first silicon nitride layer;
bonding a surface of a second semiconductor support to the metal layer;
separating the stack from the first support;
selectively etching the metal layer to decrease its width with respect to a lateral dimension of the first silicon nitride layer; and
isotropically depositing a second silicon nitride layer on the semiconductor region.

21. The method according to claim 20, wherein the second semiconductor support is bonded to the metal layer by a thermocompression bonding or by a molecular bonding.

22. The method according to claim 20, wherein the bonding comprises bonding the metal layer to the second semiconductor support via a stack of bonding layers.

23. The method according to claim 22, wherein the stack of bonding layers comprises two silicon oxide layers.

24. The method according to claim 22, wherein the stack of bonding layers comprises two gold layers and an anti-diffusion layer.

\* \* \* \* \*